United States Patent [19]

Wright

[11] 4,322,677
[45] Mar. 30, 1982

[54] SYSTEM AND METHOD FOR LOCATING RESISTIVE FAULTS AND INTERCONNECT ERRORS IN MULTI-CONDUCTOR CABLES

[75] Inventor: Benjamin K. Wright, Palo Alto, Calif.

[73] Assignee: Minnesota Mining and Manufacturing Company, Saint Paul, Minn.

[21] Appl. No.: 20,981

[22] Filed: Mar. 16, 1979

[51] Int. Cl.³ .......................................... G01R 31/08
[52] U.S. Cl. .................................................. 324/52
[58] Field of Search ......................... 324/52, 66, 67; 179/175.3 A, 175.3 F

[56] References Cited

U.S. PATENT DOCUMENTS

| | | | |
|---|---|---|---|
| 2,651,021 | 9/1953 | Hays | 324/52 |
| 2,717,992 | 9/1955 | Weintraub | 324/52 X |
| 2,769,868 | 11/1956 | Brownlow | 324/52 X |
| 3,155,897 | 11/1964 | Rice | 324/52 |
| 3,597,680 | 8/1971 | Haddon | 324/67 X |
| 3,831,086 | 8/1974 | Pesto | 324/67 |
| 3,991,363 | 11/1976 | Lathrop | 324/52 |

OTHER PUBLICATIONS

Majlinger, A., Locating Conductor Faults with Sound "Whistler", Bell Laboratories Record, Mar., 1954, pp. 102–107.

Primary Examiner—Gerard R. Strecker
Attorney, Agent, or Firm—Cruzan Alexander; Donald M. Sell; Robert L. Marben

[57] ABSTRACT

System and method for locating resistive faults and interconnect errors between the conductors of a cable such as a telephone cable. An alternating magnetic field is applied to the cable at successive points along the same and the signal produced by the induced voltage is monitored at one end of the cable. With a resistive fault or an interconnect error, the signal at the end of the cable is discernibly greater when the magnetic field is applied between the sensor and the fault than when the field is applied beyond the fault. In either case, the location of the fault is indicated by the change in the sensor signal as the field is applied at points on opposite sides of the fault. The signal information is communicated to the person who is applying the magnetic field to the cable for use by him in locating the fault.

6 Claims, 4 Drawing Figures

SYSTEM AND METHOD FOR LOCATING RESISTIVE FAULTS AND INTERCONNECT ERRORS IN MULTI-CONDUCTOR CABLES

This invention pertains generally to the location of faults in cables and more particularly to a system and method for locating resistive faults and interconnect errors between the conductors of a cable such as a telephone cable.

Resistive faults are most often caused by water entering the cable through imperfections or damage to the outer protective covering. Overhead cables are subject to humidity, rain and temperature variations, and underground cables are subject to ground water. This water will rapidly deteriorate paper insulation or will travel to points where the insulation is imperfect, for example, at splice locations, and will cause resistive paths between several conductors and/or the metallic shield, if any, of the cable. Resistive faults can cause problems such as noise, circuit failure, arc-over, and corrosion.

Interconnect errors are caused by human error in splicing sections of cable together. The most common interconnect error is failure to match both conductors of a pair from one section to the same pair in the next section of cable. The two pairs are thus unbalanced and are subject to excessive noise pick-up from external magnetic or electrostatic fields. More complex interconnect errors are also common in the field.

Techniques currently employed to locate resistive faults between the conductors of a cable include bridge measurements, time-domain reflectometry, tracing of applied currents with a search coil, and the application of high voltages to weld the faulted conductors together so that the fault can then be located by one of the other techniques. All of these techniques are subject to certain limitations and disadvantages. Bridge measurements require a good ungrounded conductor; knowledge of the resistance, length and gauge of the section under test; and a series of calculations to resolve these factors into distance. Time-domain measurement require a high degree of interpretive skill by the operator, the ability to detect faults greater than about 10 times the impedance of the conductors under test is limited, and such measurements are further limited by foreign circuit elements such as bridge lifters, loading coils and built-out capacitors in telephone cables. Systems utilizing an unshielded search coil or inductor known as a search coil to trace an applied current are subject to interference from electrostatic and electromagnetic noise, and require application of relatively high currents which can produce temporary clearing of the resistive faults due to the heating of moisture in the area of the fault. The "burn-out" technique, or application of a high voltage, is hazardous to both the customer and persons working on associated cables and, in addition, frequently causes faults in otherwise unfaulted conductors due to arc-over.

Interconnect errors in paired multi-conductor cables are most commonly located by the use of a search coil to trace an applied alternating current; time-domain reflectometry measurements; or by capacitance ratio measurements. The search coil method is subject to limitations as discussed above; time domain and capacitance ratio techniques require interpretive skill and errors may result from manufacturing irregularities and factors which alter the dielectric properties or physical characteristics such as length or diameter of the cable.

It is in general an object of the invention to provide a new and improved system and method for locating faults in cables.

Another object is to provide a system and method of the above character which can be employed for locating either resistive faults or interconnect errors.

Another object is to provide a system and method of the above character which overcome the disadvantages and limitations of the techniques heretofore employed for locating resistive faults and interconnect errors.

These and other objects are achieved in accordance with the invention by applying an alternating magnetic field to the cable at successive points along the same and monitoring the signal produced by the induced voltage at one end of the cable. With a resistive fault or an interconnect error, the signal at the end of the cable is discernibly greater when the magnetic field is applied between the sensor and the fault than when the field is applied beyond the fault. In either case, the location of the fault is indicated by the change in the sensor signal as the field is applied at points on opposite sides of the fault. The signal information is communicated to the person who is applying the magnetic field to the cable for use by him in locating the fault.

Figure 1:
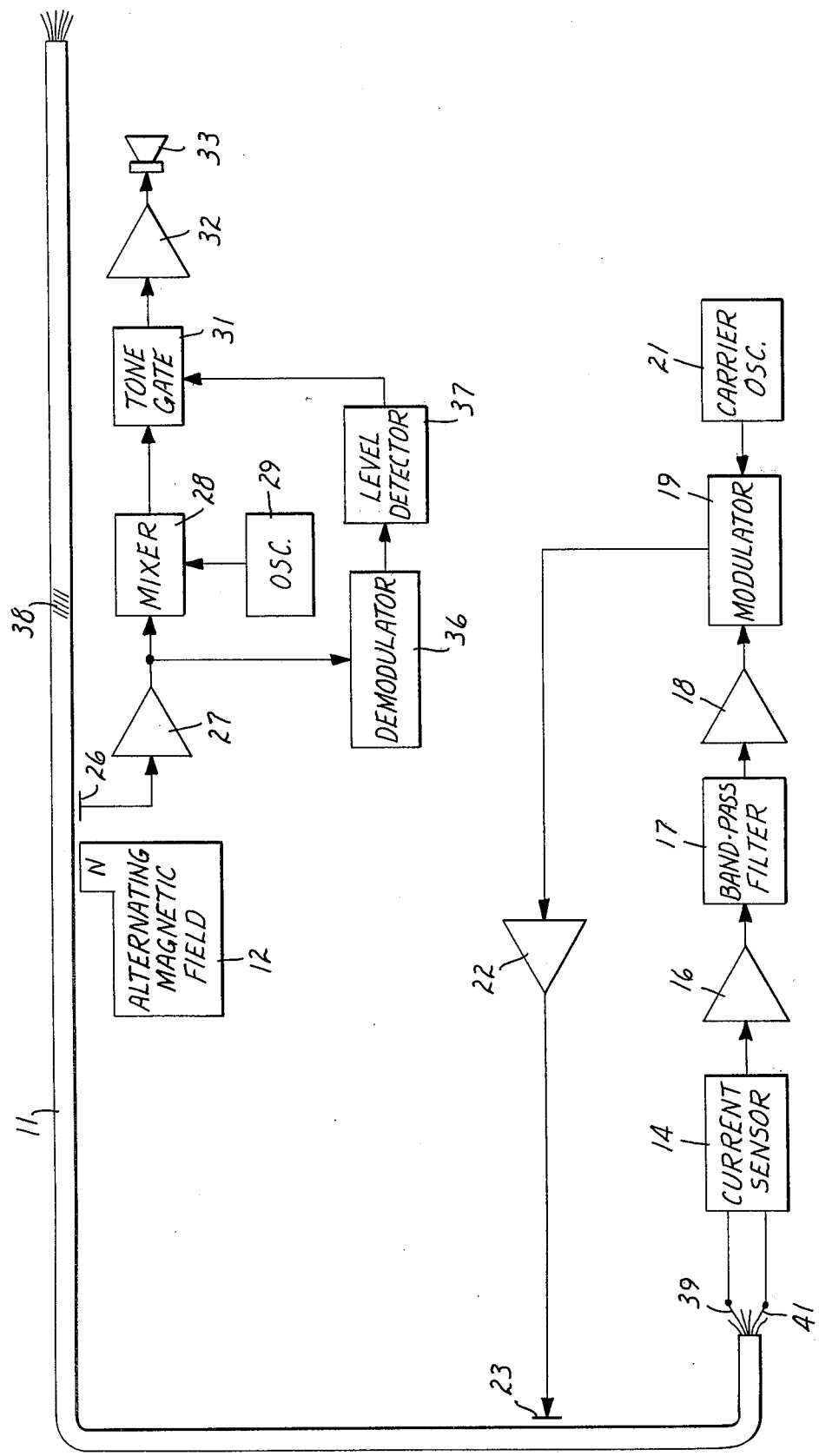
FIG. 1 is a block diagram of one embodiment of a system for locating faults in cables according to the invention.

In the drawings, the fault-locating system is illustrated in connection with a cable 11 having a plurality of conductors which are arranged in pairs. Such cables are commonly utilized in the telephone industry and in other communications systems, and in some instances they include a metallic shield. As illustrated in FIG. 1, the system includes means for applying an alternating magnetic field to the cable at successive points along the same to induce a small voltage, e.g., a few millivolts, on the conductors. This means comprises a suitable source 12 with means for applying the field to the cable such that the conductors are cut by the lines of force generated by the source. The voltage generated in the conductors by the source is a function of magnetic field intensity, and since non-paired conductors will normally be at different distances from the magnetic field source, a small differential voltage, e.g., several microvolts, will exist between these conductors. The alternating field preferably has a frequency in the sub-audible range (e.g., 300 Hz or less), and a frequency of about 30 Hz or less has been found to be particularly satisfactory. The low frequency permits effective rejection of power line frequencies and harmonics thereof, and interwire capacitance and normally encountered transmission enhancement devices such as load coils, built-out capacitors, bridge lifters, etc., present relatively insignificant series or shunt impedances. In addition, filters and other circuits for use with frequencies in this range can be constructed with components of standard values.

Means is provided for monitoring the signal produced in the conductors by the alternating magnetic field and transmitting this information to the person applying the field to the cable. In the embodiment illustrated, this means includes a current sensor 14 which produces an output voltage corresponding to the input current applied thereto. The sensor is connected to the conductors at one one end of the cable in a manner discussed more fully hereinafter. Differential voltage between non-paired conductors will cause current to flow through the fault and the sensor. The sensor is preferably shielded to permit detection of the induced signal even in the presence of electrostatic and electromagnetic interference.

The output of the current sensor is connected to the input of an amplifier 16, and the output of the amplifier is connected to the input of a band-pass filter 17 which is tuned to the frequency of the alternating field. The output of the filter is connected to the input of an amplifier 18, and the output of this amplifier is connected to the input of a modulator 19 for modulation onto a carrier from an oscillator 21. The output of the modulator is connected to an amplifier 22, and the output of this amplifier is coupled to the cable by suitable means such as a coupling capacitor 23. Thus, in the embodiment illustrated, the cable itself is utilized as a transmission line for carrying information about the signal produced by the field back to the person applying the field. However, it should be understood that any suitable communications link can be employed for this purpose.

Means is provided for receiving the signal transmitted over the cable and processing this signal to determine the location of the fault. This means includes a pickup coil 26 coupled to the cable and connected to the input of an amplifier 27. This amplifier is tuned to selectively pass the modulated carrier or received signal. The output of the amplifier is connected to the input of a mixer 28 where the received signal is combined with a signal from an oscillator 29 to produce an audio signal which is delivered to the input of a tone gate 31. The output of this gate is connected to the input of an audio amplifier 32, and the output of this amplifier is connected to a speaker 33.

The output of amplifier 27 is also connected to the input of a demodulator 36, and the output of the demodulator is connected to the input of a level detector 37. The output of the level detector is connected to the control input of tone gate 31 to control the passage of the audio signal from mixer 28 to amplifier 32. In the preferred embodiment, the level detector has an adjustable threshold level which, as discussed more fully hereinafter, permits the system to be utilized for locating a plurality of faults along the cable.

In the preferred embodiment, elements 26-37 are combined with field source 12 in a portable test set which can be moved along the cable as desired.

Operation and use of the system of FIG. 1 and therein the method of the invention for locating a resistive fault are as follows. It is assumed that the fault, designated 38 in FIG. 1, exists between two non-paired conductors 39,41 at an unknown location along the cable. The inputs of the current sensor are connected to the faulted conductors at a pedestal or other convenient point toward one end of the cable. At a convenient point beyond the fault, the conductors under test are left unterminated. When the alternating magnetic field is applied to the cable, it induces unequal voltages in non-paired conductors 39,41. When the field is applied at points between the sensor and the fault, the induced unequal voltages produce a discernible current which flows through the fault and is detected by sensor 14. When the field is applied beyond the fault, no current will flow, since the conductors are unterminated, and there is no current for the sensor to detect. In the absence of a sensed current, the received carrier signal is combined with the signal from oscillator 29 in mixer 28 to produce an audio signal which passes through gate 31 to amplifier 32 and speaker 33 to produce an audible tone which indicates that the system is operating properly. When sensor 14 detects a signal current and the output of demodulator 36 reaches the threshold level of level detector 37, gate 31 is disabled, interrupting the tone from the speaker. The tone then cycles on and off at a rate corresponding to the frequency of the magnetic field.

The location of the fault is determined by applying the magnetic field at a point somewhere along the cable. If a signal current is detected when the field is applied, the field is being applied between the sensor and the fault, and the test set is moved toward the unterminated end of the cable until the signal current disappears. If no signal current is detected when the field is applied, the field is being applied beyond the fault, and the test set is moved toward the sensor until the signal current appears. The point at which the signal current changes, i.e., appears or disappears, is the location of the fault.

As indicated hereinbefore, the system of FIG. 1 can be utilized for locating a plurality of faults along the cable. Since the faults are in parallel, faults which are closer to sensor 14 will produce larger sensor currents than will faults which are located farther from the sensor. Accordingly, by adjusting the threshold of level detector 37 for progressively larger signal currents and working toward the sensor, multiple faults can be located. Such faults can also be located by progressively decreasing the threshold of the level detector and moving away from the sensor.

Figure 2A:
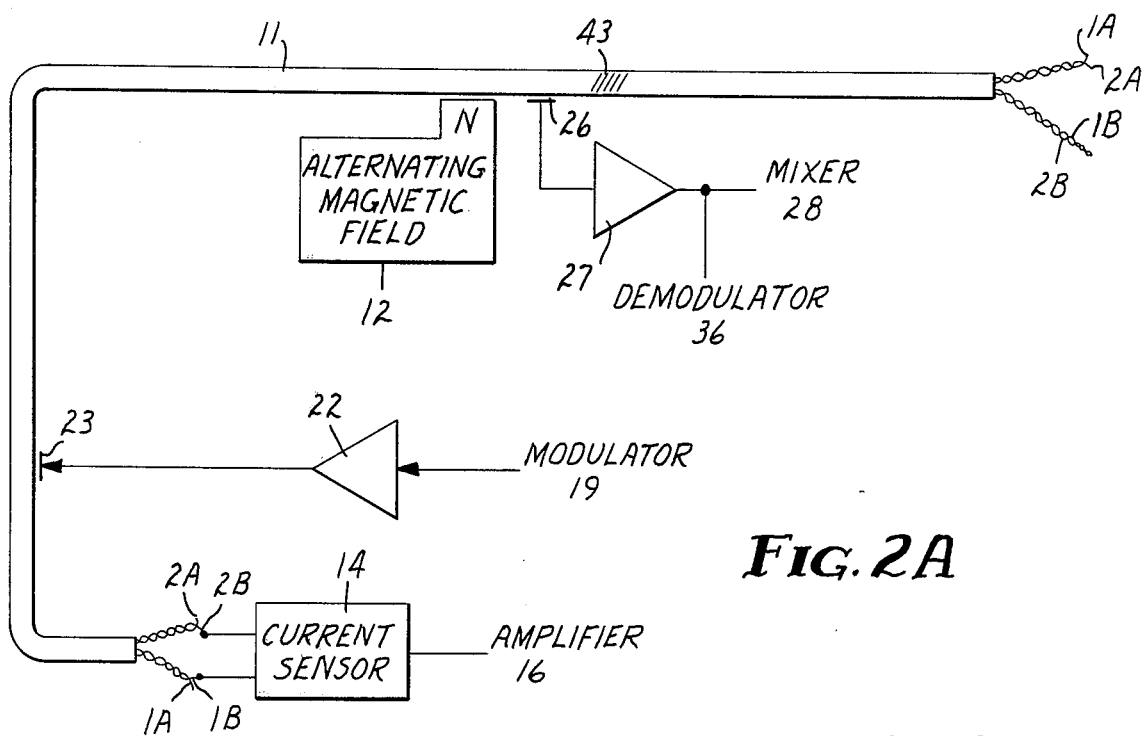
FIG. 2A illustrates the use of the system of FIG. 1 to locate an interconnect error.
Figure 2B:
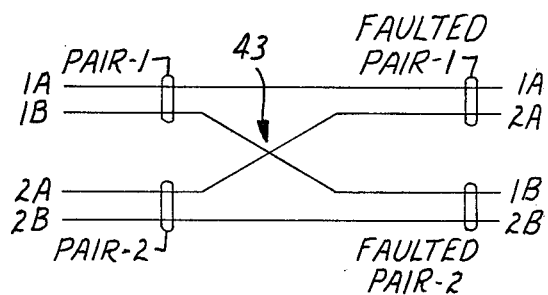
FIG. 2B is a schematic diagram illustrating the interconnect error of FIG. 2A.

The system of FIG. 1 can also be utilized for locating an interconnect error 43, as illustrated in FIGS. 2A and 2B. This error consists of a cross-connection between the conductors of two pairs in the cable. As illustrated in FIG. 2B, prior to the fault, one pair consists of conductors 1A,1B, and the other pair consists of conductors 2A,2B. At the fault, conductors 1B and 2A are cross-connected, resulting in faulted pairs after the fault consisting of conductors 1A,2A and conductors 1B,2B.

In order to locate the interconnect error, the conductors of one of the faulted pairs (e.g., conductors 1B,2B) are connected together at a convenient point beyond the fault, and these same two conductors are connected to the inputs of current sensor 14 at a convenient point before the fault toward the other end of the cable. When the alternating magnetic field is applied to the cable between the sensor and fault, unequal voltages will be induced on the nonpaired conductors 1B,2B, producing a current which is detected by sensor 14. When the field is applied beyond the fault or interconnect error, the voltages induced in the two conductors will be substantially equal, and no current will be sensed at the other end of the cable. The error is located by applying the field at successive points along the cable until the signal current changes as discussed above.

Figure 3:
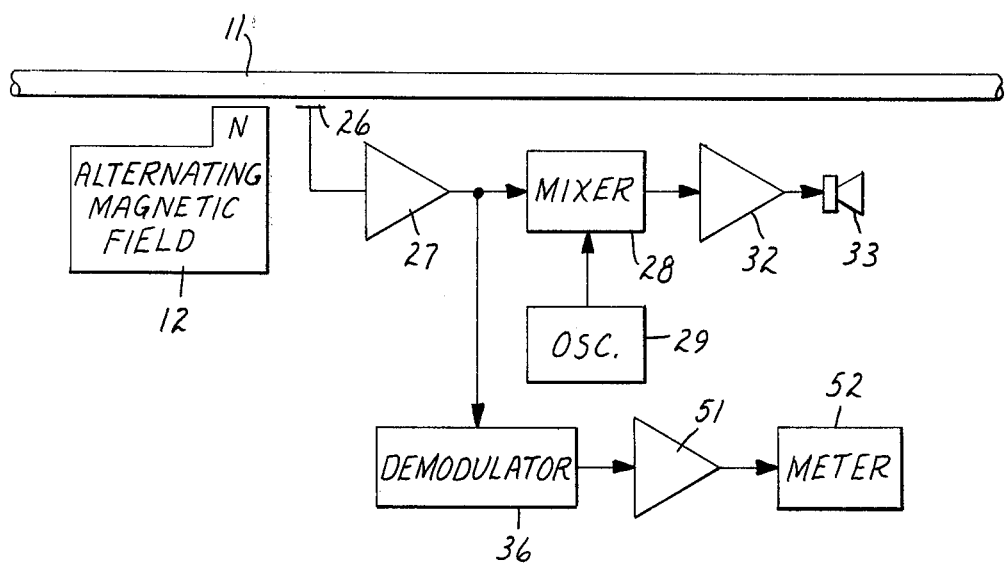
FIG. 3 is a fragmentary block diagram of another embodiment of a system incorporating the invention for locating faults in cables.

The system illustrated in FIG. 3 is generally similar to the system of FIG. 1, and like reference numerals designate corresponding elements in the two embodiments. In FIG. 3, however, the output of mixer 28 is connected directly to the input of amplifier 32, and the audio tone from speaker 33 is not interrupted upon detection of the signal current. In this embodiment, the output of demodulator 36 is connected to the input of an amplifier 51, and the output of this amplifier is connected to a meter 52 which provides a visual indication of the relative level of the signal current.

Operation and use of the system of FIG. 3 is generally similar to that described above for locating either resistive faults or interconnect errors. However, in this system, the audio tone is delivered continuously, and the location of the fault is determined by observing meter 52 as the magnetic field is applied at different points along the cable.

It is apparent from the foregoing that a new and improved system and method for locating faults in cables has been provided. While only certain presently preferred embodiments have been described in detail, as will be apparent to those familiar with the art, certain changes and modifications can be made without departing from the scope of the invention as defined by the following claims.

What is claimed is:

1. In a system for use with a cable having a plurality of conductors for locating a resistive fault associated with two non-paired conductors of the cable and locating an interconnect fault due to a cross-connection between the conductors of two pairs of conductors of the cable establishing faulted pairs: a sensor for connection between said two non-paired conductors of the cable toward one end thereof in the case of a resistive fault and for connection on one side of the fault between the conductors of a faulted pair due to an interconnect error while said faulted pair is connected together at a point on the other side of the fault; means for applying an alternating magnetic field at an audio frequency at successive points along the cable to induce a voltage on the conductors to which the sensor is connected, said voltage producing a signal at said sensor of a first predetermined character when the magnetic field is applied between the sensor and the fault and said voltage producing a signal at said sensor of a second predetermined character when the field is applied beyond the fault; means operatively connected to said sensor for monitoring said signal produced at said sensor to determine the location of the fault, including means for transmitting a signal corresponding to said signal produced at said sensor over the cable to be monitored at the points where the magnetic field is applied, said means for transmitting including a carrier source, means for modulating the carrier in accordance with said signal produced at said sensor, and means for applying the modulated carrier to the cable; means movable along the cable for receiving the transmitted signal; means responsive to the received transmitted signal for generating an audio tone; means for demodulating the received transmitted signal; and means responsive to the level of the demodulated signal for interrupting said audio tone when the demodulated signal reaches a predetermined level.

2. The system of claim 1 wherein the means for interrupting the tone comprises a level detector having an adjustable threshold level and gate means controlled by the output of the level detector.

3. In a system for use with a cable having a plurality of conductors for locating a resistive fault associated with two non-paired conductors of the cable and locating an interconnect fault due to a cross-connection between the conductors of two pairs of conductors of the cable establishing faulted pairs: a sensor for connection to said two non-paired conductors of the cable toward one end thereof in the case of a resistive fault and for connection on one side of the fault to the conductors of a faulted pair due to an interconnect error while said faulted pair is connected together at a point on the other side of the fault, means for applying an alternating magnetic field at an audio frequency at successive points along the cable to induce a voltage on the conductors to which the sensor is connected, said voltage producing a signal of first predetermined character in the sensor when the magnetic field is applied between the sensor and the fault and producing a signal of second predetermined character when the field is applied beyond the fault, a carrier source, means for modulating the carrier in accordance with the sensor signal, means for applying the modulated signal to the cable for transmission therealong, means movable along the cable for receiving the transmitted signal, an oscillator, means for combining the received signal with a signal from the oscillator to produce an audio signal, a transducer responsive to the audio signal, gate means controlling passage of the audio signal to the transducer, means for demodulating the received signal, and a level detector responsive to the demodulated signal connected to the gate means for interrupting the passage of the audio signal when the demodulated signal has a predetermined level.

4. The system of claim 3 wherein the level detector has an adjustable threshold.

5. In a method for locating a resistive fault between two non-paired conductors of a cable, the steps of: connecting a sensor between said two conductors toward one end thereof; applying an alternating magnetic field at an audio frequency at successive points along the cable to induce a voltage on each of said two conductors, said voltages being unequal and producing a signal at said sensor of a first predetermined character when the magnetic field is applied between said sensor and the fault and said voltage being substantially equal and producing a signal at said sensor of a second predetermined character when the field is applied beyond the fault; transmitting a signal over the cable and receiving the transmitted signal near the points where the magnetic field is applied, wherein the transmitted signal comprises a carrier modulated in accordance with said signal produced at said sensor; generating an audio tone in response to the transmitted signal; demodulating the transmitted signal to provide a demodulated signal; and interrupting the audio tone when the demodulated signal reaches a predetermined level.

6. In a method for locating an interconnect fault between two pairs of conductors in a cable, the steps of: connecting one conductor of each pair together beyond the fault; connecting a sensor between the one conductor of each pair prior to the fault; applying an alternating magnetic field at an audio frequency to the cable at successive points along the same to induce a voltage on each of the conductors connected to the sensor, said voltages being different and producing a signal at the sensor of a first predetermined character in the sensor when the field is applied prior to the fault and said voltages being substantially equal and producing a signal at the sensor of a second predetermined character when the field is applied beyond the fault; transmitting a signal over the cable and receiving the transmitted signal near the points where the magnetic field is applied, wherein the transmitted signal comprises a carrier modulated in accordance with the said signal produced at the sensor; generating an audio tone in response to the transmitted signal; demodulating the transmitted signal to provide a demodulated signal; and interrupting the audio tone when the demodulated signal reaches a predetermined level.

* * * * *